(12) United States Patent
Tavernier et al.

(10) Patent No.: US 9,818,621 B2
(45) Date of Patent: *Nov. 14, 2017

(54) CYCLIC OXIDE SPACER ETCH PROCESS

(71) Applicant: Applied Materials, Inc., Santa Clara, CA (US)

(72) Inventors: Aurelien Tavernier, East Palo Alto, CA (US); Qingjun Zhou, San Jose, CA (US); Tom Choi, Sunnyvale, CA (US); Yungchen Lin, Los Angeles, CA (US); Ying Zhang, Santa Clara, CA (US); Olivier Joubert, Meylan (FR)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/398,011

(22) Filed: Jan. 4, 2017

(65) Prior Publication Data
US 2017/0243754 A1     Aug. 24, 2017

Related U.S. Application Data

(60) Provisional application No. 62/298,286, filed on Feb. 22, 2016.

(51) Int. Cl.
| *H01L 21/311*  | (2006.01) |
| *H01L 21/3115* | (2006.01) |
| *H01L 21/3105* | (2006.01) |
| *H01L 21/8234* | (2006.01) |

(52) U.S. Cl.
CPC .... *H01L 21/31116* (2013.01); *H01L 21/3105* (2013.01); *H01L 21/31155* (2013.01); *H01L 21/823431* (2013.01)

(58) Field of Classification Search
None
See application file for complete search history.

(56) References Cited

U.S. PATENT DOCUMENTS

| 5,431,778 | A  |   | 7/1995  | Dahm et al. |
| 9,478,433 | B1 | * | 10/2016 | Zhou .................. H01L 21/0337 |
| 2009/0146322 | A1 | * | 6/2009 | Weling ............... H01L 21/0337 |
|  |  |  |  | 257/786 |
| 2013/0093026 | A1 |   | 4/2013 | Wann et al. |
| 2013/0164940 | A1 |   | 6/2013 | Raley et al. |
| 2014/0170853 | A1 |   | 6/2014 | Shamma et al. |
| 2014/0187009 | A1 |   | 7/2014 | Lii et al. |
| 2014/0187046 | A1 |   | 7/2014 | Posseme et al. |
| 2014/0273292 | A1 |   | 9/2014 | Posseme et al. |
| 2014/0273524 | A1 |   | 9/2014 | Nguyen et al. |

(Continued)

*Primary Examiner* — Allan Olsen
(74) *Attorney, Agent, or Firm* — Patterson + Sheridan LLP (57) ABSTRACT

Embodiments described herein relate to methods for etching a substrate. Patterning processes, such as double patterning and quadruple patterning processes, may benefit from the embodiments described herein which include performing an inert plasma treatment to implant ions into a spacer material, performing an etching process on an implanted region of the spacer material, and repeating the inert plasma treatment and the etching process to form a predominantly flat top spacer profile. The inert plasma treatment process may be a biased process and the etching process may be an unbiased process. Various processing parameters, such as pressure, may be controlled to influence a desired spacer profile.

20 Claims, 5 Drawing Sheets

(56) References Cited

U.S. PATENT DOCUMENTS

2015/0102400 A1     4/2015   Chen et al.
2015/0155176 A1     6/2015   Mignot et al.
2016/0293437 A1*   10/2016   Zhou .................. H01L 21/0337
2016/0307772 A1*   10/2016   Choi ................. H01L 21/31116

* cited by examiner

CYCLIC OXIDE SPACER ETCH PROCESS

CROSS-REFERENCE TO RELATED APPLICATIONS

This application claims benefit of U.S. Provisional Patent Application No. 62/298,286, filed Feb. 22, 2016, the entirety of which is herein incorporated by reference.

BACKGROUND

Field

Embodiments of the present disclosure generally relate to methods of patterning and etching a substrate. More specifically, embodiments described herein relate to material modification and etching processes to manufacture spacer features with a flat top profile.

Description of the Related Art

In response to an increased need for smaller electronic devices with denser circuits, devices with three dimensional (3D) structures, such as fin field effect transistors (FinFETs) have been developed. Forming sub-10 nm node structures is desired but complicated by limitations and complexities associated with various patterning and lithography processes.

For example, multiple patterning processes, such as self-aligned double patterning (SADP) and self-aligned quadruple patterning (SAQP) processes, may not adequately provide reliable patterning given the small pitch size requirements associated with formation of sub-10 nm node structures. Other lithography processes, such as litho-etch-litho-etch (LELE) processes which utilize 193 nm immersion photolithography, may increase the line width roughness (LWR) of a resist used to pattern features on the substrate.

Conventional double and quadruple double patterning schemes generally involve etching of a spacer material and removal of a mandrel material to leave a mask pattern created by individual spacers. However, conventional spacer etching processes often result in asymmetric spacer profiles. For example, rounding of a spacer shoulder region adjacent a mandrel structure may result in an undesirable pattern transfer during subsequent spacer deposition and etching processes. Inconsistencies and asymmetries in spacer etching may affect pattern transfer which can result in adjacent features having inconsistent critical dimensions, depths, shapes, etc. Moreover, current lithography and patterning processes are time consuming, which reduces throughput for device processing.

Accordingly, improved spacer etching methods are needed.

SUMMARY

In one embodiment, a method of patterning a substrate is provided. The method includes biasing a substrate having mandrel structures and silicon oxide spacer material formed thereon in a processing chamber. The silicon oxide spacer material is exposed to an inert plasma to implant ions in one or more regions of the silicon oxide spacer material at a first pressure. The implanted regions of the silicon oxide spacer material are exposed to an etchant plasma to remove a portion of the silicon oxide spacer material in the processing chamber at a second pressure. The second pressure is at least about three orders of magnitude greater than the first pressure. The exposing the silicon oxide spacer material to an inert plasma and the exposing the implanted regions of the silicon oxide spacer material to an etchant plasma are repeated until the mandrel structures are exposed. The mandrel structures are removed and the exposing the silicon oxide spacer material to an inert plasma and the exposing the implanted regions of the silicon oxide spacer material to an etchant plasma are performed until a uniform silicon oxide spacer material top surface profile is achieved.

In another embodiment, a method of patterning a substrate is provided. The method includes biasing a substrate having one or more silicon mandrel structures and a silicon oxide spacer material formed thereon in a process chamber. The silicon oxide spacer material is exposed to a hydrogen plasma to implant hydrogen ions in one or more regions of the silicon oxide spacer material. The implanted regions of the silicon oxide spacer material are exposed to a fluorine etchant plasma to remove a portion of the silicon oxide spacer material in the processing chamber at a pressure of between about 2 Torr and about 4 Torr. The mandrel structures are removed and the exposing the silicon oxide spacer material to a hydrogen plasma and the exposing the implanted regions of the silicon oxide spacer material to an etchant plasma is performed until a uniform silicon oxide spacer material top surface profile is achieved.

In yet another embodiment, a method of patterning a substrate is provided. The method includes biasing a substrate having one or more silicon mandrel structures and a silicon oxide spacer material formed thereon in a process chamber. The silicon dioxide spacer material is exposed to an unbiased hydrogen plasma to implant hydrogen ions at an angle normal to a top surface of the silicon dioxide spacer material in one or more regions of the silicon dioxide spacer material. The implanted regions of the silicon dioxide spacer material are exposed to a fluorine etchant plasma generated by a remote plasma source to remote a portion of the silicon dioxide spacer material in the process chamber. The silicon mandrel structures are removed and the exposing the silicon dioxide spacer material to a hydrogen plasma and the exposing the implanted regions of the silicon dioxide spacer material to an etchant plasma are repeated until a uniform silicon dioxide spacer material top surface profile is achieved.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods for etching a substrate. Patterning processes, such as double patterning and quadruple patterning processes, may benefit from the embodiments described herein which include performing an inert plasma treatment to implant ions into a spacer material, performing an etching process on an implanted region of the spacer material, and repeating the inert plasma treatment and the etching process to form a predominantly flat top spacer profile. The inert plasma treatment process may be a biased process and the etching process may be an unbiased process. Various processing parameters, such as pressure, may be controlled to influence a desired spacer profile.

A substrate having mandrel structures and a spacer material layer disposed thereon may be processed according to the embodiments described herein. The inert plasma treatment process may utilize a capacitively-coupled plasma and a suitable chemistry to implant ions into regions of the spacer material layer without removing portions of the spacer material. The inert plasma treatment process may be biased to control implantation of ions into desired regions of the spacer material layer. An unbiased etching process may utilize a capacitively-coupled plasma with a suitable process gas to etch the implanted regions of the spacer material in a cyclic manner by repeating the plasma ion implantation and plasma etching processes until a predominantly flat top spacer profile is achieved. In one embodiment, a pressure maintained in a processing chamber during the unbiased etching process may be at least about three orders of magnitude greater than the pressure maintained in the processing chamber during the inert plasma treatment process.

Figure 1:
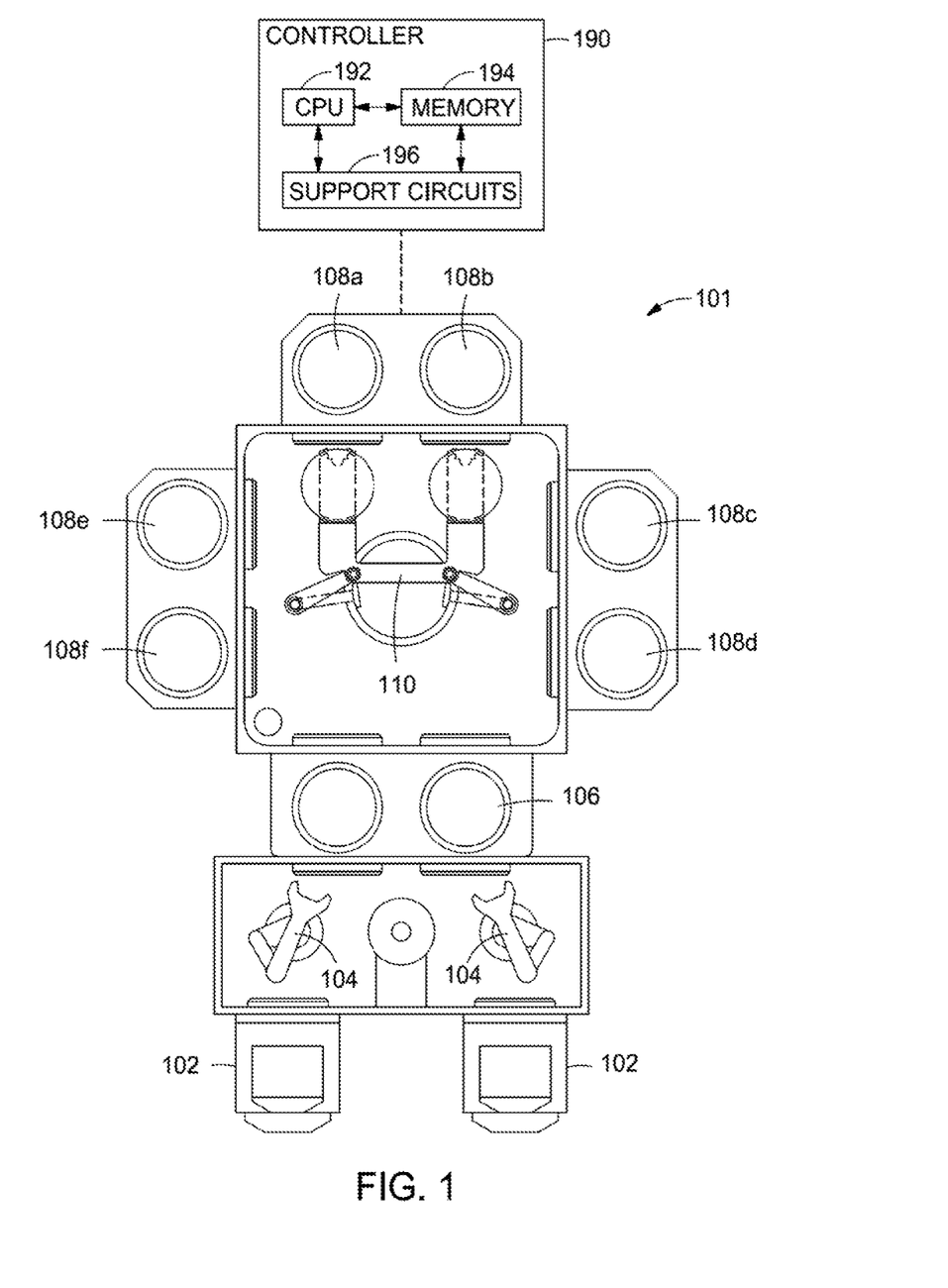
FIG. 1 illustrates a schematic, plan view of an exemplary processing system in which embodiments of the disclosure may be practiced.

FIG. 1 illustrates a schematic, plan view of a processing system 101 which may be utilized to perform the methods described herein. The processing system 101 may perform various processes, such as deposition processes, etching processes, and baking and curing processes, among others. Examples of processing systems which may be utilized include the ENDURA® and PRODUCER® platforms, available from Applied Materials, Inc., Santa Clara, Calif. However, it is contemplated that suitably configured platforms from other manufacturers may be utilized in accordance with the embodiments described herein. The processing system 101 includes a pair of front opening unified pods 102. Substrates are generally provided from the front opening unified pods 102. One or more first robots 104 retrieve the substrates from the front opening unified pods 102 and place the substrates into a loadlock chamber 106. One or more second robots 110 transport the substrates from the loadlock chamber 106 to one or more processing chambers 108a-108f (collectively processing chambers 108). Each of the processing chambers 108 may be configured to perform a number of substrate processing operations, such as plasma modification, ion implantation, plasma etching, epitaxial layer deposition, atomic layer deposition (ALD), chemical vapor deposition (CVD), physical vapor deposition (PVD), pre-clean, degas, orientation, and other substrate processes.

The substrate processing chambers 108 may include one or more system components for modifying and/or etching a material deposited on a substrate. Examples of substrate processing chambers which may be utilized include the RADION™ processing chamber available from Applied Materials, Inc., Santa Clara, Calif. However, it is contemplated that suitably configured processing chambers from other manufacturers may be utilized in accordance with the embodiments described herein. In one configuration, two pairs of the processing chambers, for example, 108c-108d and 108e-108f, may be used to modify a material on the substrate, and the third pair of processing chambers, for example, 108a-108b, may be used to remove material from the substrate. In another configuration, all of the processing chambers 108a-108f may be configured to modify a material on the substrate and remove material from the substrate. In this configuration, each pair of processing chambers, 108a-108b, 108c-108d, 108e-108f, may be configured to perform a plasma modification and/or ion implantation process and a selective etching process.

In one embodiment, processing chambers configured to perform a selective etching process may utilize a dry plasma etching process to remove a previously modified material. Processing chambers configured to modify material or implant ions into a material, such as a spacer material, may utilize an inert plasma modification process. In one embodiment, the processing chambers configured to modify material or implant ions may utilize an electron beam to form a plasma. However, other methods of forming a plasma may also be utilized. The processing system 101 described herein may be utilized to perform the processes described herein. Additionally, any one or more of the processes described herein may be performed in a chamber(s) separated from the processing system 101.

The above-described processing system 101 can be controlled by a processor based system controller such a controller 190. For example, the controller 190 may be configured to control flow of various process gases and purge gases from gas sources, during different operations of a substrate process sequence. The controller 190 includes a programmable central processing unit (CPU) 192 that is operable with a memory 194 and a mass storage device, an input control unit, and a display unit (not shown), such as power supplies, clocks, cache, input/output (I/O) circuits, and the like, coupled to the various components of the processing system 101 to facilitate control of the substrate processing. The controller 190 also includes hardware for monitoring substrate processing through sensors in the processing system 101, including sensors monitoring the process gas and purge gas flow. Other sensors that measure system parameters such as substrate temperature, chamber atmosphere pressure and the like, may also provide information to the controller 190.

To facilitate control of the processing system 101 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Material modification/ion implantation, etching, and other processes are generally stored in the memory 194, typically as a software routine. The software routine may also be stored and/or executed by a second CPU (not shown) that is remotely located from the hardware being controlled by the CPU 192.

The memory 194 is in the form of computer-readable storage media that contains instructions, that when executed by the CPU 192, facilitates the operation of the processing system 101. The instructions in the memory 194 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2:
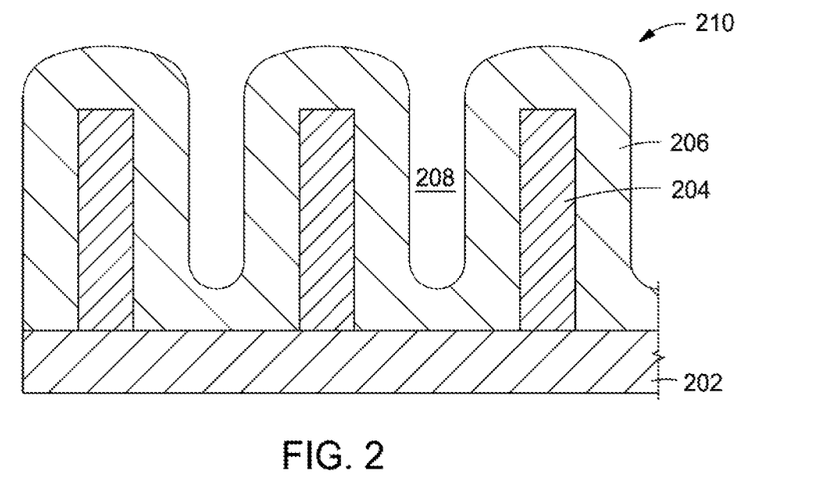
FIG. 2 illustrates a partial cross-sectional view of a substrate having mandrel structures and a spacer material formed thereon according to one embodiment described herein.

FIG. 2 illustrates a partial cross-sectional view of a substrate 202 having mandrel structures 204 and a spacer material 206 formed thereon according to one embodiment described herein. The substrate 202 may be formed from suitable materials, such as semiconducting materials, oxide materials, and the like. In one example, the substrate 202 may be a silicon oxide or silicon nitride containing material. In other embodiments, the substrate 202 may be a material layer, such as an etch stop layer, disposed on a substrate. The mandrel structures 204 may be formed from various materials, including silicon containing materials, III-V materials, or the like. For example, the mandrel structures 204 may be formed from an amorphous silicon material.

The spacer material 206 may be formed from suitable spacer or hardmask materials, such as silicon containing materials, nitride containing materials, and the like. In certain embodiments, the spacer material 206 may be a silicon nitride material, a silicon oxide material (i.e. silicon dioxide), a polysilicon material, or a titanium nitride material. It is contemplated that the materials selected for the mandrel structures 204 and the spacer material 206 may be suitable for use in the fabrication of FinFET structures. It is also contemplated that the materials selected for the mandrel structures 204 and the spacer material 206 may have different characteristics to facilitate selective etching processes.

Generally, the mandrel structures 204 may extend from the substrate 202 and the spacer material 206 may be formed in a layer over the mandrel structures 204 and the substrate 202. The spacer material 206 may be deposited by various techniques, such as chemical vapor deposition (CVD), physical vapor deposition (PVD), or other suitable processes. In one embodiment, the spacer material 206 may be predominantly conformally deposited over the mandrel structures 204 and the substrate 202. The spacer material 206, after deposition, may exhibit a rounded profile in a shoulder region 210 of the spacer material 206. The mandrel structures 204 may be spaced apart such that when the spacer material 206 is deposited, a trench 208 may be formed between adjacent mandrel structures. In the embodiments provided below, processing parameters are generally described with regard to the processing of a 300 mm substrate, however, it is contemplated the other size substrates, such as 200 mm or 450 mm substrates, may benefit from the embodiments described herein.

Figure 3:
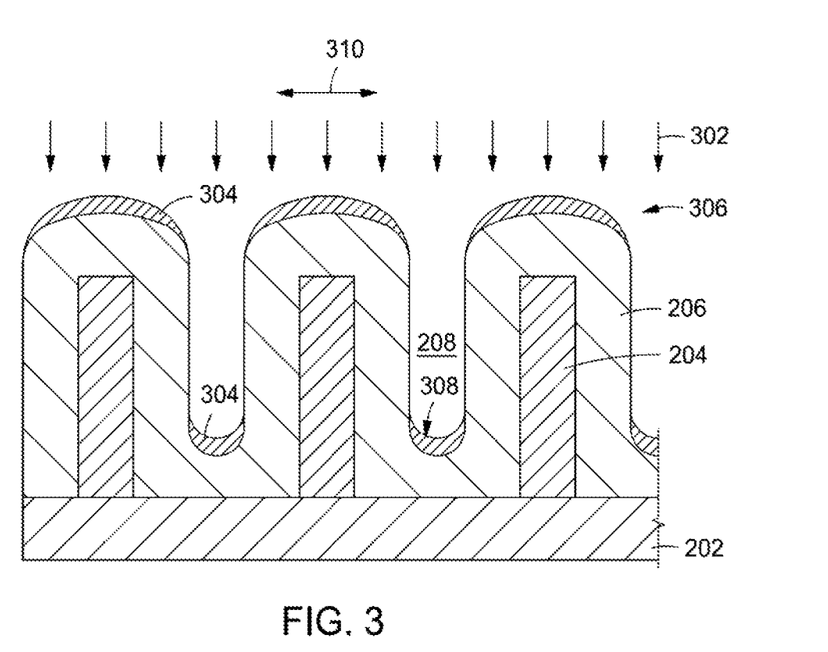
FIG. 3 illustrates a partial cross-sectional view of the substrate of FIG. 2 after performing a spacer material modification process according to one embodiment described herein.

FIG. 3 illustrates a partial cross-sectional view of the substrate 202 of FIG. 2 after performing a spacer material modification process according to one embodiment described herein. The spacer material 206 may be modified in an inert plasma modification process. As utilized herein, an "inert plasma" is non-etching plasma, rather, the inert plasma is a utilized for material modification. The inert plasma modification process may utilize suitable chemistry to modify or alter the material properties of the spacer material 206 without removing the spacer material 206. For example, the physical structure or the chemical make-up of the spacer material 206 may be altered after exposure to an inert plasma 302 as a result of ion species implanted into the spacer material 206. In one embodiment, the spacer material 206 is exposed to the inert plasma 302 to form modified regions 304 of the spacer material. The modified regions 304 of the spacer material 206 are generally located at a top region 306 above the mandrel structure 204 and a bottom region 308 within the trench 208. The top region 306 generally includes all of or at least a portion of the shoulder region 210.

The inert plasma may be generated by a remote plasma source or may be generated in situ in the processing chamber. The inert plasma generation process may be an inductively coupled plasma process or a capacitively-coupled plasma process. Generally, a bias may be utilized during the inert plasma modification process to influence directionality of the plasma with regard to the spacer material 206. For example, the substrate 202 may be biased to direct ions toward the substrate 202. In one embodiment, ions may be directed toward a plane 310 parallel to the substrate at an angle between about normal to the plane 310 and about 45° to the plane 310. It is contemplated that the depth of penetration of the ions into the spacer material 206 at the top region 306 and the bottom region 308 may be determined, at least in part, by the angle at which the ions strike the spacer material 206. For example, the depth of penetration of the ions in the shoulder region 210 may be less than at other portions of the top region 306. Ions may strike the shoulder region 210 at a different angle resulting in a lesser penetration depth when compared to a portion of the spacer material 206 directly above the mandrel structure 204. However, it is believed that the depth of penetration of the ions in the top region 306 may be predominantly the same across the top region 306 of the spacer material 206.

Suitable process gases for forming the inert plasma 302 include $H_2$, $N_2$, $O_2$, Si, Ge, and noble gases, such as He, Ar, or Xe, and mixtures and combinations thereof, among others. Suitable ion species generated from the inert plasma 302 include H ions, He ions, Ar ions, N ions, O ions, and the like. Various processing parameters may also be controlled during the inert plasma modification process. For example, a bias power utilized to impart directionality to the plasma may be between about 10 W and about 1500 W, such as between about 50 W and about 200 W, for example, about 100 W. A pressure in the processing chamber during the inert plasma modification process may be maintained between about 5 mT and about 300 mT, such as between about 10 mT and about 200 mT, for example, about 20 mT.

In one embodiment, a silicon oxide material, such as silicon dioxide, may be utilized as the spacer material 206 and H ions may be utilized to modify the spacer material 206. In this embodiment, it is contemplated that the H ions may be incorporated into the silicon oxide material without sputtering the silicon oxide spacer material. It is believed that sputtering may be reduced or eliminated due to the relatively small size of the H ions and the ability of the H ions to be incorporated into the silicon oxide material matrix without substantial disruption. In one example, H ions were generated from an H processing gas provided at a flow rate of about 100 sccm in a processing chamber environment having a pressure of about 20 mT. A bias voltage utilized to direct the H ions toward the silicon oxide spacer was maintained between about 200 V and about 600 V. Under the aforementioned processing conditions, it was found that approximately 0 Å of silicon oxide spacer were sputtered during the plasma modification process. The depth of H ion implantation into the silicon oxide spacer was between about 20 Å and about 120 Å, indicating that the depth of H ion implantation may be selectively controlled by the amount of bias power utilized.

In the embodiments described above, utilizing a relatively light ion species, such as H ions, provides for modification of the spacer material 206 without undesirable damage to the spacer material 206. The lighter ions may also provide for a greater depth of penetration into the spacer material 206 when compared to heaver ions having a larger size. As such, the spacer material 206 may be modified to enable subsequent selective etching processes.

Figure 4:
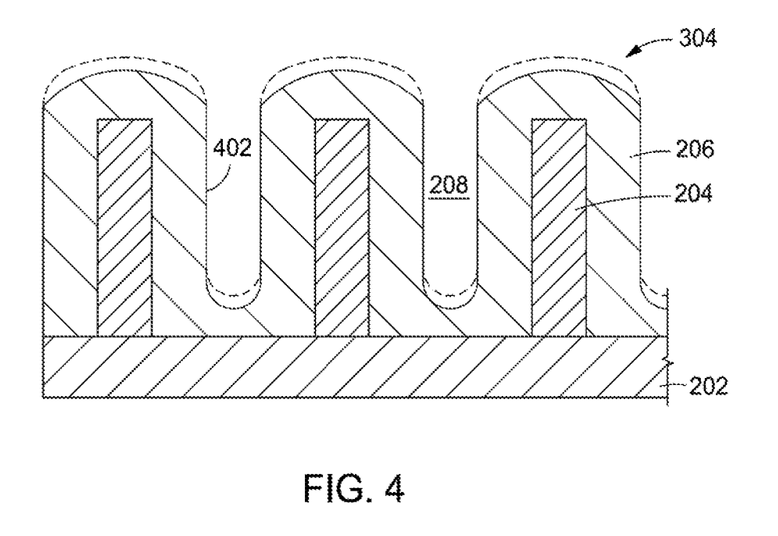
FIG. 4 illustrates a partial cross-sectional view of the substrate of FIG. 3 after performing an etching process according to one embodiment described herein.

FIG. 4 illustrates a partial cross-sectional view of the substrate 202 of FIG. 3 after performing an etching process according to one embodiment described herein. The etching process may be performed to remove the modified regions 304 formed in the inert plasma modification process. The removed modified regions 304 are illustrated in FIG. 4 as dashed lines, indicating where the modified regions 304 existed prior to removal during the etching process. The etching process is configured to expose the modified regions 304 to an etchant plasma which is selective to the modified regions 304 as opposed to sidewalls 402 of the spacer material 206.

In one embodiment, the etchant plasma may be generated by a remote plasma source. The etchant plasma may be unbiased and the etching characteristics may be predominantly isotropic. However, the process gas chemistry utilized to form the etchant plasma may be configured to selectively remove the modified regions 304 relative to other regions of the spacer material 206, such as the sidewalls 402. Various process gases suitable for forming the etchant plasma include $NF_3$, $NH_3$, $N_2$, $H_2$, $H_2O_2$, $O_2$, $Cl_2$, $F_2$, and combinations and mixtures thereof. The process gases formed into the etchant plasma may be provided to the processing chamber in the presence of a carrier gas, such as He or Ar.

A power suitable for etchant plasma generation by a remote plasma source may be between about 10 W and about 2000 W, such as between about 20 W and about 100 W, for example, about 40 W. A pressure in the processing chamber during the etchant plasma process may be maintained between about 500 mT and about 10 T, such as between about 1 T and about 5 T, for example, between about 2 T and about 4 T. In one embodiment, a silicon oxide spacer material modified with a H inert plasma may be etched by a combination of $NF_3$ and $NH_3$ process gases carried by He gas. In this embodiment, a ratio of $NF_3$:$NH_3$:He may be between about 1:10:33.3. A flow rate of the $NF_3$ process gas may be between about 1 sccm and about 100 sccm, such as between about 25 sccm and about 50 sccm, for example, about 30 sccm. A flow rate of the $NH_3$ process gas may be between about 100 sccm and about 1000 sccm, such as between about 200 sccm and about 400 sccm, for example, about 300 sccm. A flow rate of the He carrier gas may be between about 100 sccm and about 5000 sccm, such as between about 500 sccm and about 2000 sccm, for example, about 1000 sccm.

Under the aforementioned processing conditions, a fluorine etchant plasma may be generated and the modified regions 304 of the spacer material 206 may be selectively removed. During the selective etching process, the substrate 202 or the processing environment may be heated to a temperature of between about 100° C. to about 500° C. to sublimate the reactant product of the fluorine etchant and the modified regions 304 of the spacer material 206. The reactant product may then be exhausted from the processing chamber.

The pressure utilized during the etching process may be about three orders of magnitude greater than the pressure utilized during the plasma modification process. It is believed that the increased pressure may result in the formation of ammonium salts. The ammonium salts are relatively large molecules which may be too large to exist in the trenches 208. Thus, a loading effect may be realized near the top region 306. As a result, the ammonium salts may reduce exposure of the bottom region 308 to fluorine radicals. Accordingly, the bottom region 308 may be etched more slowly than the top region 306.

Figure 5:
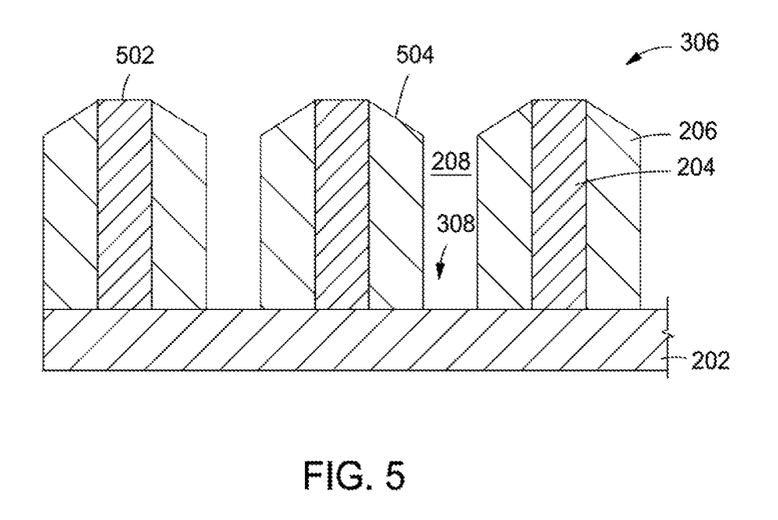
FIG. 5 illustrates a partial cross-sectional view of the substrate of FIG. 4 after performing a cyclic spacer material removal process according to one embodiment described herein.

It is contemplated that the pressures utilized during the etching process, in combination with the implantation depth of ions during the inert plasma modification process may also contribute to the formation of an improved profile, such as a relatively flat profile, of the spacer material at the top region 306. As a result, the shoulder region 210 may be removed and predominantly flat profile may be obtained as illustrated in FIG. 5. However, as illustrated, the top region 306 may still exhibit some flatness non-uniformity due to asymmetric exposure to plasma during the cyclic etch process. It is believed the flatness non-uniformity may result from the presence of the mandrel structures 204 which prevent exposure of one side of the spacer material 206 to the plasma relative to an unprotected, opposing side of the spacer material 206.

It is contemplated that less than an entire desirable amount of spacer material 206 may be removed after performing the inert plasma modification process and the etchant plasma material removal process. Accordingly, the inert plasma modification process and the etchant plasma material removal processes may be repeated in a cyclic manner until the mandrel structures 204 are exposed or until a predominantly flat top profile of the spacer material 206 is formed. It is contemplated that the process may be cycled one or more times, for example, between about 2 times and about 5 times. After the cyclic material modification and etching process form a predominantly flat top spacer profile, the substrate 202 may by processed by various other substrate processing operations.

FIG. 5 illustrates a partial cross-sectional view of the substrate 202 of FIG. 4 after performing a cyclic spacer material removal process according to one embodiment described herein. In this example, the spacer material 206 may be etched by the cyclic material removal process until a top surface 502 of the mandrels structures 204 is exposed and/or is substantially coplanar with a top surface 504 of the spacer material 206. The cyclic material removal process may also remove spacer material 206 present in the bottom region 308 of the trench 208 to expose the substrate 202 between adjacent vertically extending spacer material structures. It is believed that by controlling the pressure during the plasma etching operation of the cyclic spacer material removal process, the profile of the top surface 504 may be predominantly planar, with flatness non-uniformities of the top surface 504 influenced during the cyclic etching process by the presence of the mandrel structures 204. As illustrated, the top surface 504 of the spacer material 206 may angle slightly downward laterally outward from the mandrel structures 204.

Figure 6:
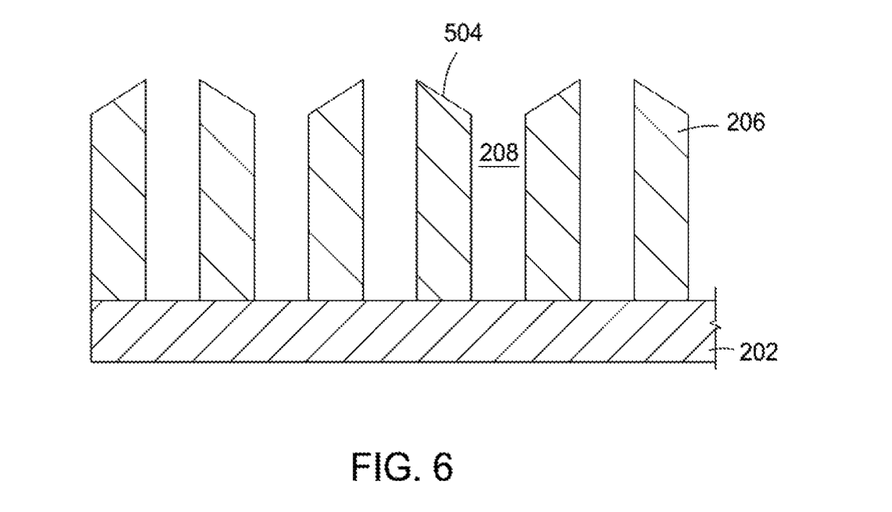
FIG. 6 illustrates a partial cross-sectional view of the substrate 202 of FIG. 5 after performing a mandrel structure removal process according to one embodiment described herein.

FIG. 6 illustrates a partial cross-sectional view of the substrate 202 of FIG. 5 after performing a mandrel structure removal process according to one embodiment described herein. For example, amorphous silicon mandrel structures 204 may be etched by a plasma formed from $NF_3$ and H precursor gases. It is contemplated that the mandrel structure etchant plasma may be selected to provide selective etching of the mandrel structures 204 relative to the spacer material 206, such that the spacer material 206 remains predominantly unetched/unmodified by the mandrel structure etchant plasma. Accordingly, trenches 208 may be defined between each adjacent spacer material feature after removal of the mandrel structures 204.

Figure 7:
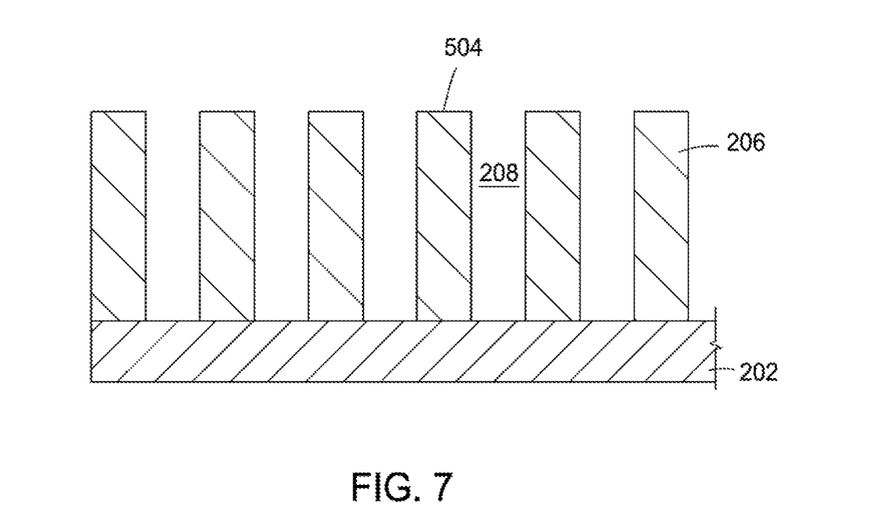
FIG. 7 illustrate a partial cross-sectional view of the substrate 202 of FIG. 6 after performing a cyclic spacer material removal process according to one embodiment described herein.

FIG. 7 illustrate a partial cross-sectional view of the substrate 202 of FIG. 6 after performing a cyclic spacer material removal process according to one embodiment described herein. The material modification and etching processes may be cyclically performed again after removal of the mandrel structures 204 to further modify the profile of the spacer material 206. More specifically, the top surface 504 of the spacer material may be modified by the cyclic material removal process to generate spacer material features having predominantly uniform profiles. The cyclic material removal process may be performed between about 1 and about 5 times until a desired top surface profile is achieved. In one embodiment, the top surface 504 may be predominantly flat, as illustrated in FIG. 7. Alternatively, the top surface 504 may be rounded. It is contemplated that the topography of the top surface 504 may be selected by utilizing a desired processing volume pressure during the cyclic material removal process. Regardless of the top surface profile, the top surface 504 of the spacer material 206 may be predominantly uniform across the spacer material features to provide for improved pattern transfer characteristics.

Figure 8:
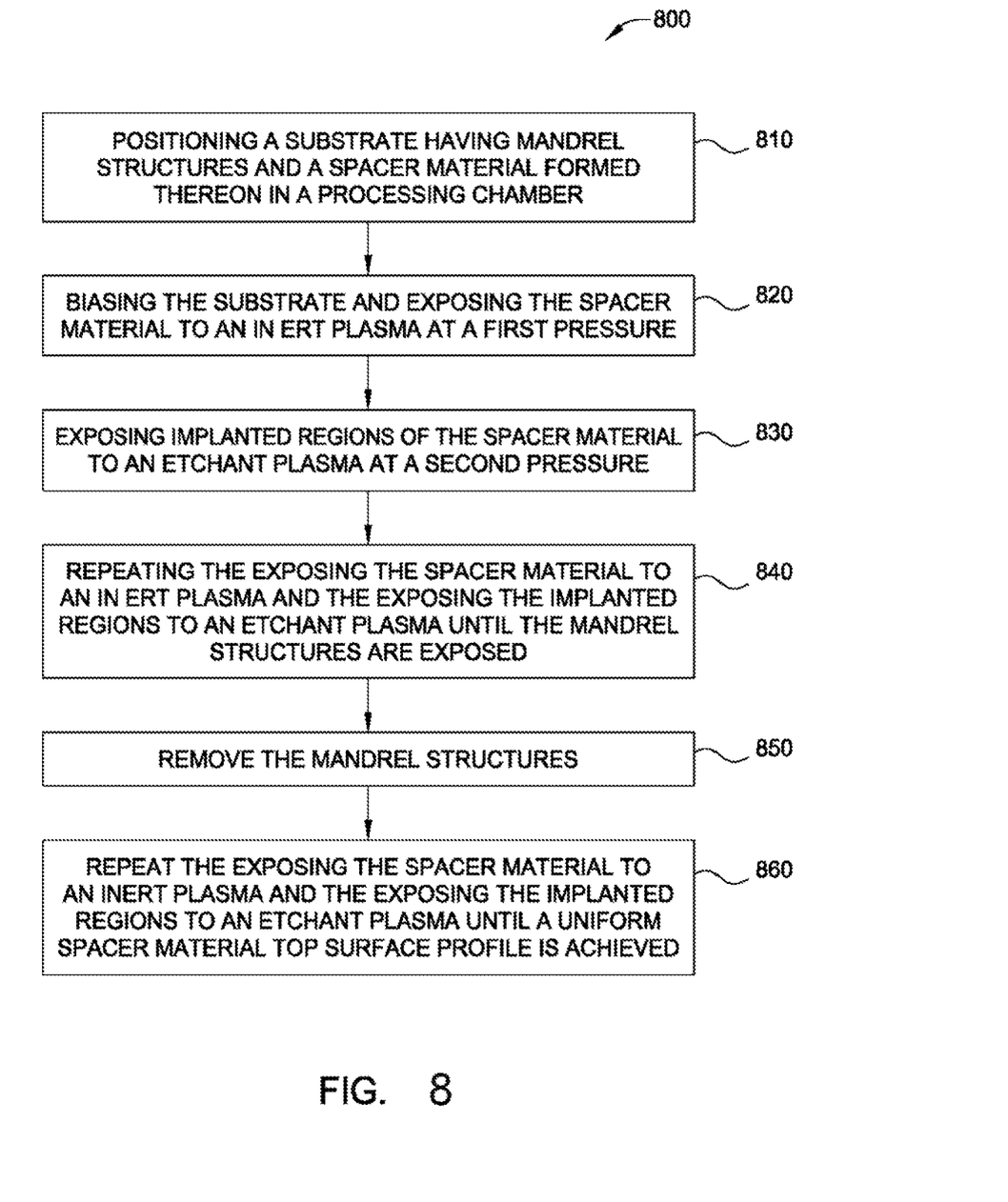
FIG. 8 illustrates a flow diagram of a method for processing a substrate according to embodiments described herein.

FIG. 8 illustrates a flow diagram of a method 800 for processing a substrate according to embodiments described herein. At operation 810, a substrate having mandrel structures and a spacer material formed thereon may be positioned in a processing chamber. The processing chamber may be a chamber suitable for performing plasma modification and plasma etching processes, such as the processing chambers 108 described in FIG. 1. In one embodiment, the plasma modification and plasma etching processes may be performed in a single chamber. In another embodiment, the plasma modification and plasma etching may be performed in different chambers. At operation 820, the substrate may be biased the spacer material may be exposed to an inert plasma at a first pressure. Generally, the first pressure may be between about 5 mT and about 300 mT. Ions may be implanted into the spacer material to form implanted or modified regions.

At operation 830, the implanted regions of the spacer material may be exposed to an etchant plasma at a second pressure. Generally, the second pressure may be about three orders of magnitude greater than the first pressure. At operation 840, operations 820 and 830 may be repeated until the mandrel structures are exposed.

At operation 850, the mandrel structures may be removed. For example, amorphous silicon mandrel structures may be etched by a plasma formed from $NF_3$ and H precursor gases. It is contemplated that the mandrel structure etchant plasma may be selected to provide selective etching of the mandrel structures relative to the spacer material, such that the spacer material remains predominantly unetched/unmodified by the mandrel structure etchant plasma. The mandrel structures may be etched such that the underlying substrate or etch stop layer is exposed upon mandrel structure removal.

At operation 860, operations 820 and 830 may be repeated until the top surface profile of the spacer material features are predominantly uniform. In one embodiment, the top surface of the spacer material features may be predominantly flat. In another embodiment, the top surface of the spacer material features may be rounded. Regardless of the topography of the top surface of the spacer material, adjacent spacer material features may be uniform to provide for improved pattern transfer characteristics.

By separating the modification and etching processes and controlling various processing conditions, directionality of the etching process may be improved and may result in an improved spacer material profile. For example, a predominantly flat or rounded spacer material profile may be achieved. The flat or rounded profile may improve pattern transfer during subsequent processing operations by more precisely defining the critical dimensions of the device features being formed.

Moreover, a polymer protective layer to protect sidewalls of the spacer material is not needed as a result of the improved spacer material etching control when utilizing the cyclic spacer material removal processes described herein. Thus, multiple patterning processes may benefit from the embodiments described herein and sub-10 nm node structures may be patterned more effectively and precisely.

While the foregoing is directed to embodiments of the present disclosure, other and further embodiments of the disclosure may be devised without departing from the basic scope thereof, and the scope thereof is determined by the claims that follow.

What is claimed is:
1. A method of patterning a substrate, comprising:
biasing a substrate in a processing chamber, the substrate having mandrel structures and silicon oxide spacer material formed thereon;
exposing the silicon oxide spacer material to an inert plasma to implant ions in one or more regions of the silicon oxide spacer material at a first pressure;
exposing the implanted regions of the silicon oxide spacer material to an etchant plasma to remove a portion of the silicon oxide spacer material in the processing chamber at a second pressure, wherein the second pressure is at least about three orders of magnitude greater than the first pressure;

repeating the exposing the silicon oxide spacer material to an inert plasma and the exposing the implanted regions of the silicon oxide spacer material to an etchant plasma until the mandrel structures are exposed;

removing the mandrel structures; and repeating the exposing the silicon oxide spacer material to an inert plasma and the exposing the implanted regions of the silicon oxide spacer material to an etchant plasma until a uniform silicon oxide spacer material top surface profile is achieved.

2. The method of claim 1, wherein the exposing the silicon oxide spacer material to an inert plasma and the exposing the modified regions of the silicon oxide spacer material to an etchant plasma are performed in a single processing chamber.

3. The method of claim 1, wherein the exposing the silicon oxide spacer material to an inert plasma is performed in a first processing chamber and the exposing the modified regions of the silicon oxide spacer material to an etchant plasma is performed in a second processing chamber.

4. The method of claim 1, wherein the silicon oxide spacer material is silicon dioxide.

5. The method of claim 1, wherein a processing gas utilized to form the inert plasma is selected from the group consisting of $H_2$, $N_2$, $O_2$, noble gases, and combinations and mixtures thereof.

6. The method of claim 5, wherein a processing gas utilized to form the etchant plasma is selected from the group consisting of $H_2$, $N_2$, $H_2O_2$, $NF_3$, $NH_3$, $Cl_2$, $F_2$, and combinations and mixtures thereof.

7. The method of claim 1, wherein the biasing the substrate is performed at a power of between about 20 W and about 200 W.

8. The method of claim 1, wherein the exposing the spacer material to an inert plasma is performed at a pressure of between about 5 mTorr and about 300 mTorr.

9. The method of claim 1, wherein the etchant plasma exposure is unbiased and the etchant plasma is generated by a remote plasma source.

10. The method of claim 1, wherein the ions are implanted into the one or more regions of the silicon oxide spacer materials at an angle normal to a top surface of the spacer material.

11. A method of patterning a substrate, comprising:
biasing the substrate in a processing chamber, the substrate having one or more silicon mandrel structures and a silicon oxide spacer material formed thereon;
exposing the silicon oxide spacer material to a hydrogen plasma to implant hydrogen ions in one or more regions of the silicon oxide spacer material;
exposing the implanted regions of the silicon oxide spacer material to a fluorine etchant plasma to remove a portion of the silicon oxide spacer material in the processing chamber at a pressure of between about 2 Torr and about 4 Torr;
removing the silicon mandrel structures; and
repeating the exposing the silicon oxide spacer material to a hydrogen plasma and the exposing the implanted regions of the silicon oxide spacer material to an etchant plasma until a uniform silicon oxide spacer material top surface profile is achieved.

12. The method of claim 11, wherein the top surface profile is predominantly flat.

13. The method of claim 12, wherein the repeating is performed between about 2 times and about 5 times.

14. The method of claim 11, further comprising:
heating the substrate during the exposure to a fluorine etchant plasma to a temperature of between about 100° C. and about 500° C. to sublimate the silicon oxide spacer material of the implanted regions.

15. The method of claim 11, wherein the hydrogen ions are implanted into the one or more regions of the silicon oxide spacer material at an angle normal to a top surface of the silicon oxide spacer material.

16. A method of patterning a substrate, comprising:
biasing the substrate in a processing chamber, the substrate having one or more silicon mandrel structures and a silicon dioxide spacer material formed thereon;
exposing the silicon dioxide spacer material to an unbiased hydrogen plasma to implant hydrogen ions at an angle normal to a top surface of the silicon dioxide spacer material in one or more regions of the silicon dioxide spacer material;
exposing the implanted regions of the silicon dioxide spacer material to a fluorine etchant plasma generated by a remote plasma source to remove a portion of the silicon dioxide spacer material in the processing chamber;
removing the silicon mandrel structures; and
repeating the exposing the silicon dioxide spacer material to a hydrogen plasma and the exposing the implanted regions of the silicon dioxide spacer material to an etchant plasma until a uniform silicon dioxide spacer material top surface profile is achieved.

17. The method of claim 16, wherein the removing the silicon mandrel structures is performed by a plasma etching process.

18. The method of claim 17, wherein the plasma etching process generates an etchant plasma from $NF_3$ and H precursors.

19. The method of claim 16, wherein the substrate is heated to a temperature between about 100° C. and about 500° C. during the repeating the exposing the silicon dioxide spacer material to a hydrogen plasma and the exposing the implanted regions of the silicon dioxide spacer material to an etchant plasma.

20. The method of claim 16, wherein the exposing the silicon dioxide spacer material to an inert plasma is performed at a first pressure of between about 5 mTorr and about 300 mTorr and the exposing the implanted regions of the silicon dioxide spacer material to a fluorine etching plasma is performed at a second pressure about three orders of magnitude greater than the first pressure.

* * * * *